United States Patent
Hong et al.

(10) Patent No.: US 7,087,324 B2
(45) Date of Patent: Aug. 8, 2006

(54) MAGNETORESISTIVE SPIN-VALVE SENSOR AND MAGNETIC STORAGE APPARATUS

(75) Inventors: Jongill Hong, Seoul (KR); Hitoshi Kanai, Kawasaki (JP); Junichi Kane, Kawasaki (JP); Kenji Noma, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/664,066

(22) Filed: Sep. 16, 2003

(65) Prior Publication Data

US 2005/0276996 A1 Dec. 15, 2005

Related U.S. Application Data

(63) Continuation of application No. PCT/JP01/09447, filed on Oct. 26, 2001.

(30) Foreign Application Priority Data

Mar. 22, 2001 (WO) .................. PCT/JP01/02261

(51) Int. Cl.
*G11B 5/127* (2006.01)
(52) U.S. Cl. .................... 428/811.2; 428/814; 428/816; 360/324
(58) Field of Classification Search ........... 428/611, 428/632, 636, 637, 668, 674, 675, 676, 686, 428/336, 692, 702; 360/324.1
See application file for complete search history.

(56) References Cited

U.S. PATENT DOCUMENTS

| | | | |
|---|---|---|---|
| 5,422,571 A | 6/1995 | Gurney et al. | ............ 324/252 |
| 6,181,534 B1 | 1/2001 | Gill | |
| 6,495,275 B1 * | 12/2002 | Kamiguchi et al. | ...... 428/811.2 |

FOREIGN PATENT DOCUMENTS

| | | |
|---|---|---|
| EP | 0 845 820 | 6/1998 |
| JP | 10-313138 | 11/1998 |
| WO | WO 00/63714 | 10/2000 |

OTHER PUBLICATIONS

Egelhoff et al.; "Spectacular Electron Scattering in Metallic Thin Films"; *J. Vac. Sci. Technol.* B17(4), Jul./Aug. 1999.
de Vries et al.; "Oscillatory Interlayer Exchange Coupling with the Cu Cap Layer Thickness in Co/Cu/Co/Cu (100)"; *Phys. Rev. Lett*; vol. 75, pp. 4306; 1995.

(Continued)

*Primary Examiner*—Kevin M. Bernatz
(74) *Attorney, Agent, or Firm*—Greer, Burns & Crain, Ltd.

(57) ABSTRACT

A magnetoresistive spin-valve sensor is constructed to include a magnetic layer, a specular layer made of a metal oxide, a back layer made of Au, Cu, AuCu, AgCu, AuAgCu or an alloy thereof and interposed between the magnetic layer and the specular layer, and a metal layer disposed adjacent to the specular layer, opposite to the back layer, and made of a metal which improves GMR performance of the magnetoresistive spin-valve sensor.

5 Claims, 5 Drawing Sheets

OTHER PUBLICATIONS

Ueno et al.; "Read-Write Performance of Spin-Filter-Spin-Valve Heads"; *IEEE Trans. on Magnetics*; vol. 36, No. 5; pp. 2572-2574; Sep. 2000.

Swagten et al.; "Enhanced Giant Magnetoresistance in Spin-Valves Sandwiched Between Insulating NiO"; *Physical Review*; vol. 53, No. 14, Part 2; pp. 9109-9114.

Wang et al.; "Effect of Au Underlayers on GMR Properties of NiFe/Cu/CoFe Sandwiches"; *IEEE Trans. on Magnetics*; vol. 32, No. 5; pp. 4728-4730; Sep. 1996.

Hong et al.; "Effect of Thin Oxide Capping on Interlayer Coupling in Spin Valves"; *IEEE Trans. on Magnetics*; vol. 36, No. 5; Sep. 2000; pp. 2629-2631.

* cited by examiner

MAGNETORESISTIVE SPIN-VALVE SENSOR AND MAGNETIC STORAGE APPARATUS

This application, filed under 35 U.S.C. §111(a), is a continuation of International Application No. PCT/JP01/09447, filed Oct. 26, 2001, which claims priority from an International Application PCT/JP01/02261, filed Mar. 22, 2001.

The International Application PCT/JP01/09447 was published in the English language under International Publication Number WO 20/078021 A1 on Oct. 3, 2003. The International Application PCT/JP01/02261 was also published in the English language under International Publication Number WO 02/077657 A1 on Oct. 3, 2003.

TECHNICAL FIELD

The present invention generally relates to magnetoresistive spin-valve sensors and magnetic storage apparatuses, and more particularly to a magnetoresistive spin-valve sensor having a specular layer, and to a magnetic storage apparatus which uses such a magnetoresistive spin-valve sensor.

BACKGROUND ART

A typical magnetoresistive spin-valve sensor includes a base layer, a first magnetic (pinned) layer, a spacer layer, and a second magnetic (free) layer which are stacked in this order. By increasing the output of the magnetoresistive spin-valve sensor, it is possible to read information from magnetic recording media having a high recording density.

For example, the use of a highly conductive back layer on the free layer is proposed in a U.S. Pat. No. 5,422,571. By the provision of the back layer, the electron mean-free-path is increased due to the so-called "spin-filter effect", thereby increasing the output of the magnetoresistive spin-valve sensor.

On the other hand, the use of a specular layer on the free layer is proposed in Egelhoff et al., "Specular electron scattering in metallic thin films", J. Vac. Sci. Technol. B 17(4), July/August 1999. By the provision of the specular layer, the specularity of conduction electrons is increased, thereby increasing the spin-dependent scattering and the electron mean-free-path. As a result, the output of the magnetoresistive spin-valve sensor is increased.

It is possible to increase the output of the magnetoresistive spin-valve sensor by decreasing the thickness of the free layer because a magnetic flux density and thickness product, that is, a tBs value, decreases accordingly, where t denotes the thickness of the free layer and Bs denotes the magnetic flux density of the free layer. However, it is difficult to decrease the thickness of the free layer while maintaining a small coercive field and a small interlayer coupling field $H_{in}$ between the pinned layer and the free layer, particularly when the specular layer is in direct contact with the free layer.

Alternatively, it is also possible to increase the output of the magnetoresistive spin-valve sensor by decreasing the thickness of the spacer layer because a shunt current which does not contribute to the magnetoresistive effect decreases accordingly. But it is difficult to decrease the thickness of the spacer layer without increasing the interlayer coupling field $H_{in}$ between the pinned layer and the free layer.

DISCLOSURE OF THE INVENTION

Accordingly, it is a general object of the present invention to provide a novel and useful magnetoresistive spin-valve sensor and magnetic storage apparatus in which the problems described above are eliminated.

Another and more specific object of the present invention is to provide a magnetoresistive spin-valve sensor and a magnetic storage apparatus, which can decrease the thickness of the magnetic layer and/or the spacer layer, while maintaining a small coercive field and a small interlayer coupling field $H_{in}$ between a first magnetic (pinned) layer and a second magnetic (free) layer, so that an increased output can be obtained from the magnetoresistive spin-valve sensor.

Still another object of the present invention is to provide a magnetoresistive spin-valve sensor comprising a magnetic layer, a specular layer made of a metal oxide, a back layer, made of Au, Cu or an alloy thereof, interposed between the magnetic layer and the specular layer, and a metal layer disposed adjacent to the specular layer, opposite to the back layer, and made of a metal which improves GMR performance of the magnetoresistive spin-valve sensor. According to the magnetoresistive spin-valve sensor of the present invention, it is possible to decrease the thickness of the magnetic layer and/or a spacer layer, while maintaining a small coercive field and a small interlayer coupling field $H_{in}$ between the magnetic layer and another magnetic layer, so that an increased output can be obtained from the magnetoresistive spin-valve sensor.

A further object of the present invention is to provide a magnetic storage apparatus for reading information from a magnetic recording medium, comprising a magnetoresistive spin-valve sensor which reads the information from the magnetic recording medium, where the magnetoresistive spin-valve sensor comprises a magnetic layer, a specular layer made of a metal oxide, a back layer made of Au, Cu, AuCu, AgCu, AuAgCu or an alloy thereof and interposed between the magnetic layer and the specular layer, and a metal layer disposed adjacent to the specular layer, opposite to the back layer, and made of a metal which improves GMR performance of the magnetoresistive spin-valve sensor. According to the magnetic storage apparatus of the present invention, it is possible to decrease the thickness of the magnetic layer and/or a spacer layer of the magnetoresistive spin-valve sensor, while maintaining a small coercive field and a small interlayer coupling field $H_{in}$ between the magnetic layer and another magnetic layer, so that an increased output can be obtained from the magnetoresistive spin-valve sensor. As a result, it is possible to read information from a high-density magnetic recording medium.

Other objects and further features of the present invention will be apparent from the following detailed description when read in conjunction with the accompanying drawings.

BEST MODE OF CARRYING OUT THE INVENTION

Figure 1:
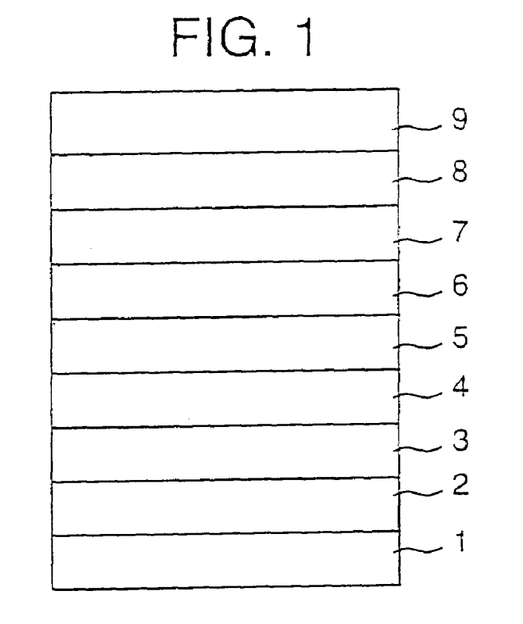
FIG. 1 is a cross sectional view showing the general structure of an important part of a first embodiment of a magnetoresistive spin-valve sensor according to the present invention.

FIG. 1 is a cross sectional view showing the general structure of an important part of a first embodiment of a magnetoresistive spin-valve sensor according to the present invention. The magnetoresistive spin-valve sensor shown in FIG. 1 generally includes a substrate 1, an underlayer 2, an antiferromagnetic layer 3, a first magnetic layer 4, a spacer layer 5, a second magnetic layer 6, a back layer 7, a specular layer 8, and a metal capping layer 9.

The first magnetic layer 4 is made of a magnetic material such as a Co-based alloy, and may have a single-layer structure or a multi-layer structure. The first magnetic layer 4 forms a pinned layer of the magnetoresistive spin-valve sensor. The spacer layer 5 is made of a nonmagnetic metal such as Cu. The second magnetic layer 6 is made of a soft magnetic material such as a Co-based alloy, and forms a free layer of the magnetoresistive spin-valve sensor. The second magnetic layer 6 may have a single-layer structure or a multi-layer structure. The back layer 7 is made of Au, Cu, AuCu, AgCu, AuAgCu or an alloy thereof. The back layer 7 may be made of a $Au_{1-x}Cu_x$ alloy, $Ag_{1-x}Cu_x$ alloy, $Au_{1-x-y}Ag_yCu_x$ alloy, where x denotes a fraction of Cu in the alloy, y denotes a fraction of Ag in the alloy, and x and y respectively are greater than 0.0 and less than 1.0 so that x+y is less than 1.0. The specular layer 8 is made of a material selected from a group of CoO, $Co_3O_4$, $Co_2O_3$, $Cu_2O$, CuO, $Al_2O_3$, NiO, FeO, $Fe_2O_3$, MnO, $TiO_2$ and alloys thereof. Further, the metal capping layer 9 is made of a material selected from a group of Ta, Ru, Ni, Fe, Pd, Pt, Mn, Cu, Co, Ti, V, Cr, Zn, Y, Zr, Nb, Mo, Rh, Ag, Au, Hf, W, Re, Os, Ir, Nb and alloys thereof.

Because the back layer 7 between the second magnetic layer 6 and the specular layer 8, the so-called spin-filter effect and an enhanced specularity of conduction electrons at the interface between the back layer 7 and the specular layer 8 are obtained. As a result, a high GMR effect can be obtained. In addition, the thickness of the second magnetic layer 6 can be controlled to a small value while keeping a low coercivity of the second magnetic layer 6, since the back layer 7 separates the second magnetic layer 6 from direct contact with the specular layer 8. The back layer 7 also decreases the interlayer coupling field $H_{in}$ between the first and second magnetic layers 4 and 6, since electron reflections can be affected at the interfaces, as may be readily understood from de Vries et al., "Oscillatory interlayer exchange coupling with the Cu cap layer thickness in Co/Cu/Co/Cu(100)", Phys. Rev. Lett., Vol. 75, pp. 4306, 1995.

Figure 2:
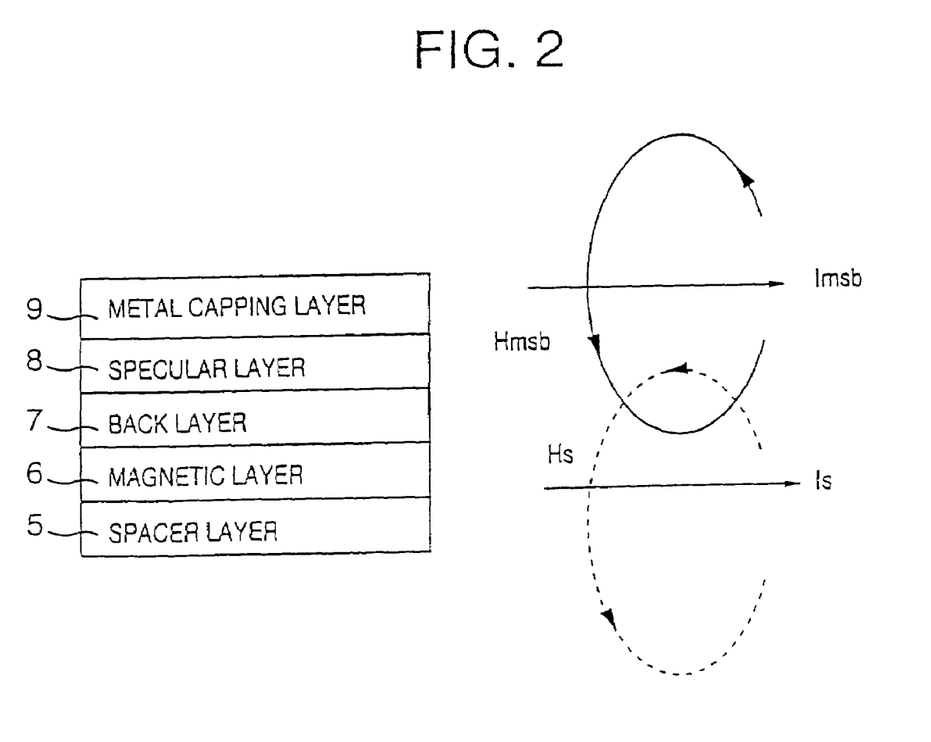
FIG. 2 is a diagram for explaining compensation of magnetic fields in the first embodiment.

The back layer 7 also makes a bias point easy to control, because a magnetic field Hmsb from the back layer 7 is opposite to a magnetic field Hs from the spacer layer 5, as may be seen from FIG. 2. FIG. 2 is a diagram for explaining compensation of the magnetic fields in this first embodiment. In FIG. 2, the left portion shows an important part of this first embodiment, and the right portion shows the magnetic fields Hmsb and Hs by a bold arrow and a phantom arrow, respectively, when a sense current is applied to the magnetoresistive spin-valve sensor. Moreover, Imsb denotes a current through the back, specular and metal cap layers 7, 8 and 9, and Is denotes a current through the spacer layer 5.

Therefore, enhanced specularity at the interface between the back layer 7 and the specular layer 8, extended electron mean-free-path from the spin-filter effect, and easy control of the bias point significantly increase the output of the magnetoresistive spin-valve sensor.

Figure 3:
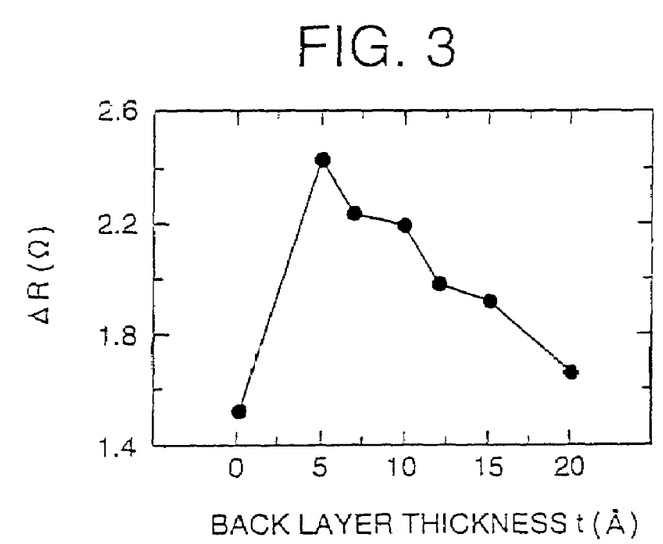
FIG. 3 is a diagram showing a back layer thickness dependence of a change in sheet resistance in the first embodiment.

FIG. 3 is a diagram showing a back layer thickness dependence of a change in sheet resistance in this first embodiment. In FIG. 3, the ordinate indicates a change in sheet resistance $\Delta R$ ($\Omega$), and the abscissa indicates a thickness t (Å) of the back layer 7. For the sake of convenience, the second magnetic layer 6 has a thickness of 40 Å, and the specular layer 8 has a thickness of 15 Å. The change in sheet resistance $\Delta R$ is a difference between maximum and minimum values of the sheet resistance R, and may be used to evaluate the performance of the magnetoresistive spin-valve sensor since the change in sheet resistance $\Delta R$ is approximately proportional to the output of the magnetoresistive spin-valve sensor. As may be seen from FIG. 3, the change in sheet resistance $\Delta R$ increases by approximately 60% when the thickness t of the back layer 7 is less than approximately 20 Å.

Figure 4:
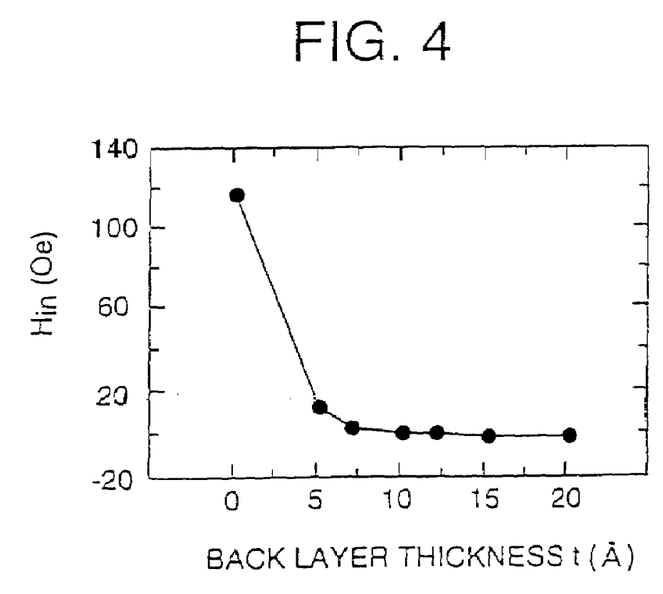
FIG. 4 is a diagram showing a back layer thickness dependence of an interlayer coupling field $H_{in}$ in the first embodiment.

FIG. 4 is a diagram showing a back layer thickness dependence of the interlayer coupling field $H_{in}$ in this first embodiment. In FIG. 4, the ordinate indicates the interlayer coupling field $H_{in}$ (Oe), and the abscissa indicates thickness t (Å) of the back layer 7. For the sake of convenience, the second magnetic layer 6 has a thickness of 40 Å, and the specular layer 8 has a thickness of 15 Å. As may be seen from FIG. 4, the interlayer coupling field Hin decreases by more than approximately 90% and stays under approximately 10 Oe when the thickness t of the back layer 7 is less than approximately 20 Å.

From FIGS. 3 and 4, it was confirmed that the GMR performance of the magnetoresistive spin-valve sensor degrades due to a significant shunting current through the back layer 7 when the back layer 7 has a thickness exceeding approximately 20 Å.

Although conventionally difficult to achieve, it was confirmed that this first embodiment can suppress the interlayer coupling field $H_{in}$ to approximately 20 Oe or less even when the thickness of the second magnetic layer 6 is 40 Å or less. In other words, it was confirmed that the output of the magnetoresistive spin-valve sensor can be increased even when an effective thickness of the second magnetic layer 6, excluding a thickness of a magnetically dead layer, is greater than 0 and less than approximately 40 Å. Therefore, this first embodiment can control the thickness of the second magnetic layer 6 while keeping soft magnetic properties, and the coercivity and the interlayer coupling field $H_{in}$ can be suppressed to approximately 20 Oe or less.

Figure 5:
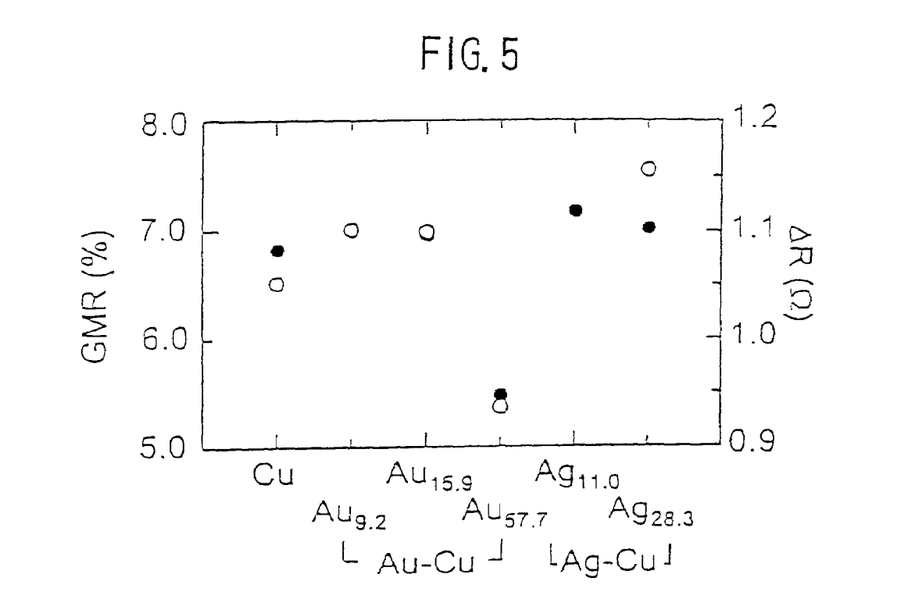
FIG. 5 is a diagram showing a GMR performance and a change in sheet resistance for a case where the back layer is made of a Cu alloy and a metal capping layer is made of Ta in the first embodiment.
Figure 6:
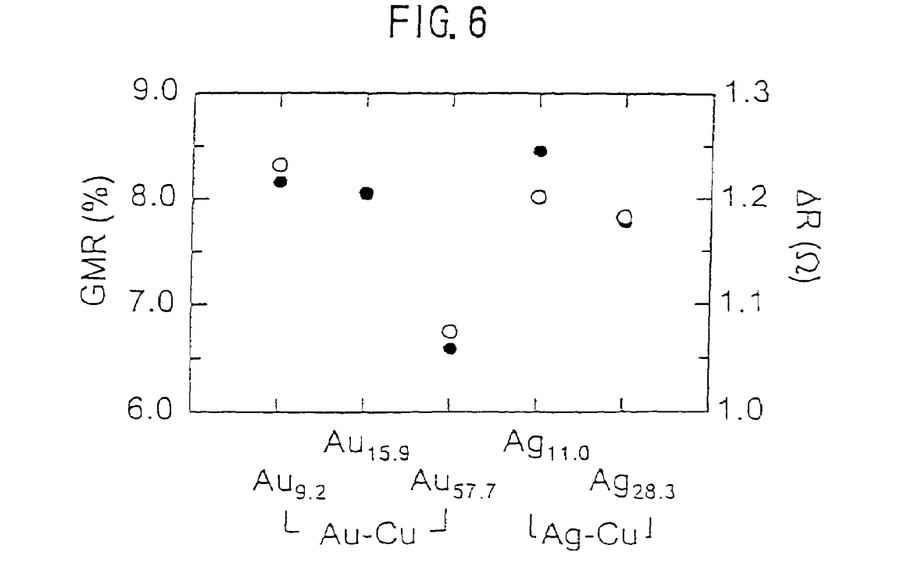
FIG. 6 is a diagram showing a GMR performance and a change in sheet resistance for a case where the back layer is made of a Cu alloy and the metal capping layer is made of Ta in the first embodiment.

FIGS. 5 and 6 respectively are diagrams showing a GMR performance and a change in sheet resistance for cases where the back layer 7 is made of Cu alloys and the metal capping layer 9 is made of Ta in this first embodiment. In FIGS. 5 and 6, a symbol "●" indicates the GMR performance, and a symbol "○" indicates the change in sheet resistance.

In FIG. 5, the right ordinate indicates the GMR performance (%) of the magnetoresistive spin-valve sensor, the left ordinate indicates the change in sheet resistance $\Delta R$ ($\Omega$), the abscissa indicates the Cu or Cu alloy used for the back layer 7, and the metal capping layer 9 has a thickness of 50 Å. In FIG. 6, the right ordinate indicates the GMR performance (%) of the magnetoresistive spin-valve sensor, the left ordinate indicates the change in sheet resistance $\Delta R$ ($\Omega$), the abscissa indicates the Cu alloy used for the back layer 7, and the metal capping layer 9 has a thickness of 10 Å.

As may be seen from FIGS. 5 and 6, it was confirmed that the MSR performance is further improved when the AgCu or AuCu alloy is used for the back layer 7, compared to the case where Cu is used for the back layer 7. In addition, as may be seen from FIG. 6, it was observed that the 10 Å thick metal capping layer 9 simulates the specular layer 8, even though the specularity seems to be small. It was also observed that the use of $Ag_{11}Cu_{89}$ or $Au_{9.2}Cu_{90.8}$ for the back layer 7, for example, especially improves the properties of the spin-valve sensor. It was also confirmed that the interlayer coupling field $H_{in}$ and the coercivity $H_c$ do not change greatly with a change in the composition of the back layer 7, and remain at small values which is necessary for obtaining a high output from the spin-valve sensor.

In addition, the metal capping layer 9 protects the specular layer 8 and the second magnetic layer 6 from chemically, physically, mechanically and thermally harsh environments during the fabrication process. As a result, degradation of the electrical and magnetic properties of the magnetoresistive spin-valve sensor caused during the fabrication process is prevented in this first embodiment, and the metal capping layer 9 positively improves GMR performance of the magnetoresistive spin-valve sensor, in addition to simply protecting the second magnetic layer 6 by a capping function.

For example, a Japanese Laid-Open Patent Application No. 10-313138 proposes a metal capping layer made of various metals, but the metal capping layer is merely provided to protect a magnetic layer disposed underneath, and does not improve the GMR performance of a magnetoresistive spin-valve sensor.

Therefore, the arrangement of the second magnetic layer 6, the back layer 7, the specular layer 8 and the metal capping layer 9 as shown in FIG. 1 generates the following advantageous features. First, the back layer 7 prevents further diffusion of oxygen into the adjacent second magnetic layer 6 during deposition of the specular layer 8 during the fabrication process, so that the coercivity of the second magnetic layer 6 remains less than approximately 20 Oe. Second, because the back layer 7 is highly conductive in the magnetoresistive spin-valve sensor, the electron mean-free-path increases due to the spin-filter effect, to thereby increase the output of the magnetoresistive spin-valve sensor. Third, the interface between the back layer 7 and the specular layer 8 increases the specularity of the conduction electrons, which increases the possibility of the spin-dependent scattering, which thereby also results in an increase in the output of the magnetoresistive spin-valve sensor.

Figure 7:
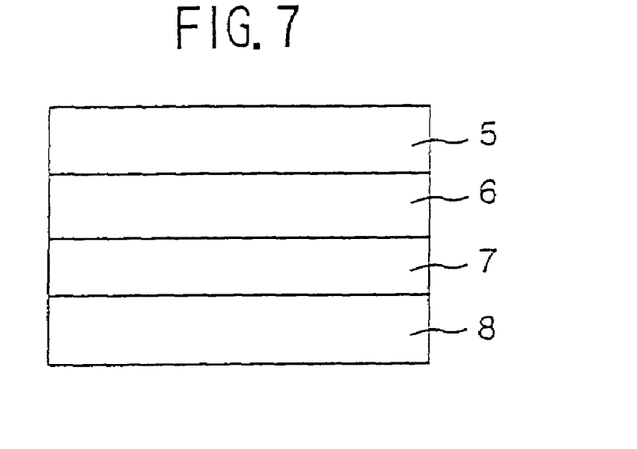
FIG. 7 is a cross sectional view showing the general structure of an important part of a second embodiment of the magnetoresistive spin-valve sensor according to the present invention.

FIG. 7 is a cross sectional view showing the general structure of an important part of a second embodiment of the magnetoresistive spin-valve sensor according to the present invention. In FIG. 7, those parts which are the same as those corresponding parts in FIG. 1 are designated by the same reference numerals, and a description thereof will be omitted.

In the first embodiment described above, the structure shown in FIG. 1 is provided at a top portion of the magnetoresistive spin-valve sensor. On the other hand, in this second embodiment, the structure shown in FIG. 7 is embedded inside the magnetoresistive spin-valve sensor. In this second embodiment, the magnetoresistive spin-valve sensor has an inverted structure as compared to that of the first embodiment, and the layers are disposed in a reverse order to that of the first embodiment.

Figure 8:
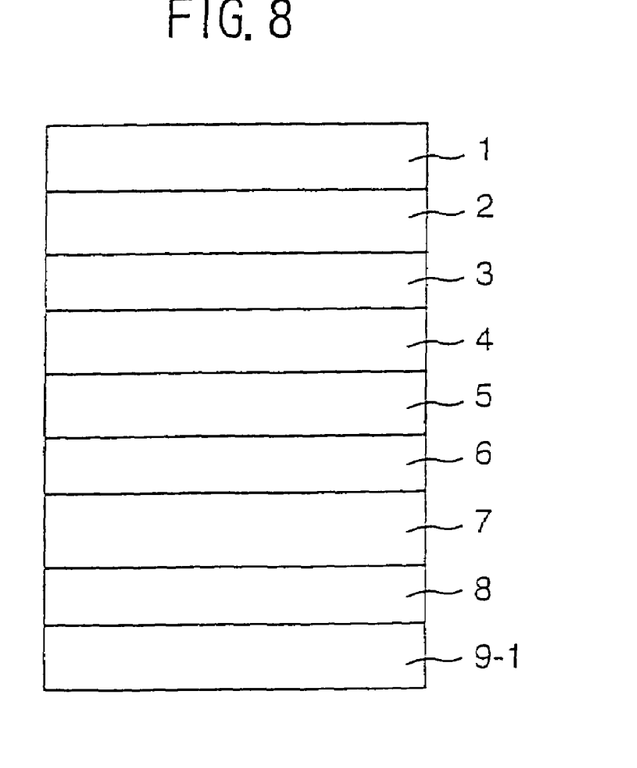
FIG. 8 is a cross sectional view showing the general structure of an important part of a third embodiment of the magnetoresistive spin-valve sensor according to the present invention.

FIG. 8 is a cross sectional view showing the general structure of an important part of a third embodiment of the magnetoresistive spin-valve sensor according to the present invention. In FIG. 8, those parts which are the same as those corresponding parts in FIG. 1 are designated by the same reference numerals, and a description thereof will be omitted.

In the first embodiment described above, the structure shown in FIG. 1 is provided at a top portion of the magnetoresistive spin-valve sensor. On the other hand, in this third embodiment, the structure shown in FIG. 7 is embedded inside the magnetoresistive spin-valve sensor. In this third embodiment, the magnetoresistive spin-valve sensor has an inverted structure as compared to that of the first embodiment, and the layers are disposed in a reverse order to that of the first embodiment.

Furthermore, in this third embodiment, a metal underlayer 9-1 is provided under the specular layer 8. The metal underlayer 9-1 can provide the rest of the magnetoresistive spin-valve sensor with a good crystallographic texture, so that the electrical and magnetic properties of the magnetoresistive spin-valve sensor are improved thereby. Particularly, the soft magnetic properties of the second magnetic layer 6 improve due to the crystallographic texture thereof which is improved by the provision of the metal underlayer 9-1.

In each of the embodiments described above, the second magnetic layer 6 may form the free layer or any magnetically responding layer of the magnetoresistive spin-valve sensor.

Figure 9:
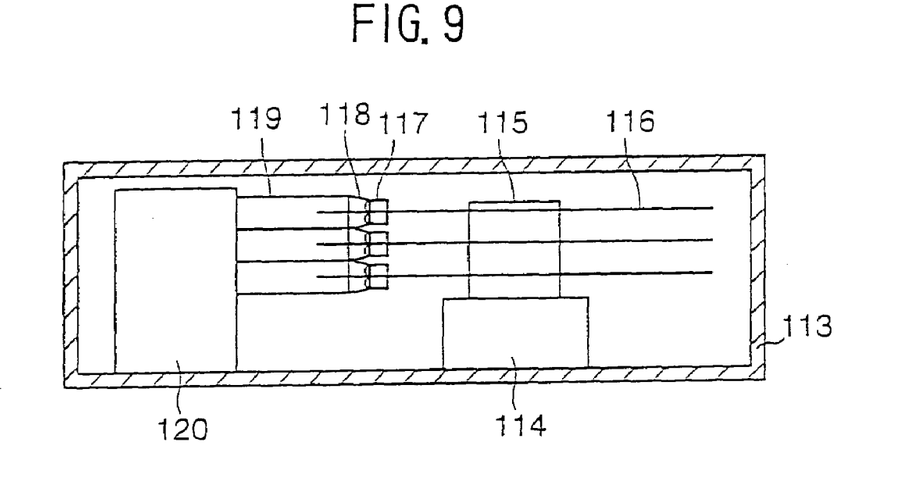
FIG. 9 is a cross sectional view showing an important part of an embodiment of a magnetic storage apparatus according to the present invention.

Next, a description will be given of an embodiment of a magnetic storage apparatus according to the present invention, by referring to FIGS. 9 and 10. FIG. 9 is a cross sectional view showing an important part of this embodiment of the magnetic storage apparatus, and FIG. 10 is a plan view showing the important part of this embodiment of the magnetic storage apparatus.

Figure 10:
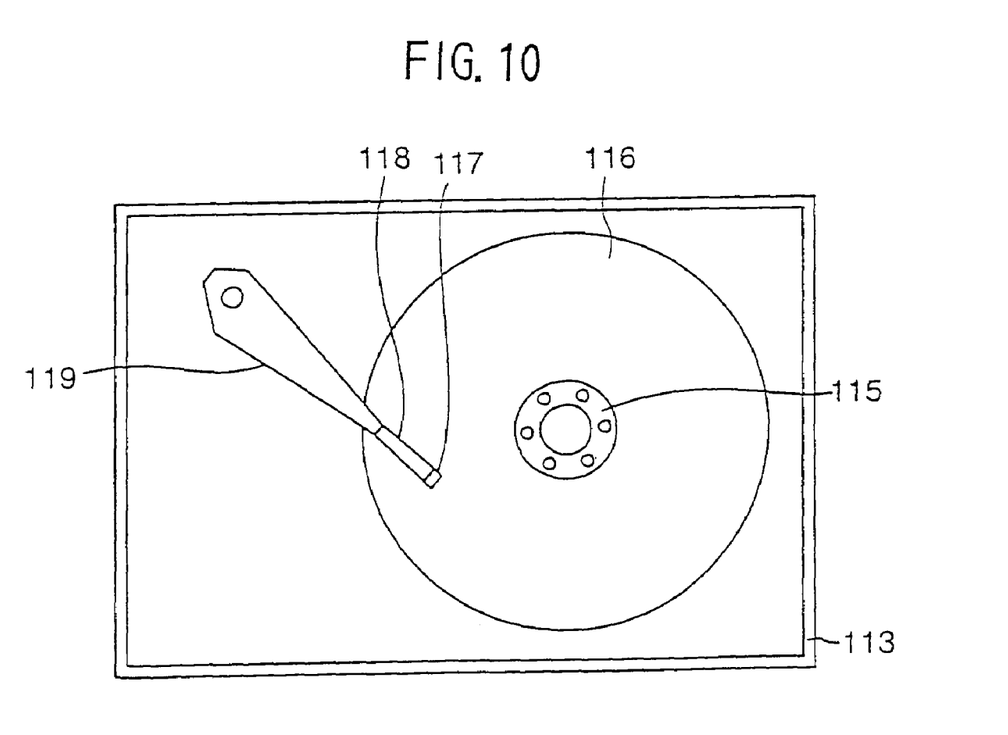
FIG. 10 is a plan view showing the important part of the embodiment of the magnetic storage apparatus.

As shown in FIGS. 9 and 10, the magnetic storage apparatus generally includes a housing 113. A motor 114, a hub 115, a plurality of magnetic recording media 116, a plurality of recording and reproducing heads 117, a plurality of suspensions 118, a plurality of arms 119, and an actuator unit 120 are provided within the housing 113. The magnetic recording media 116 are mounted on the hub 115 which is rotated by the motor 114. The recording and reproducing head 117 is made up of a reproducing head and a recording head such as an inductive head. Each recording and reproducing head 117 is mounted on the tip end of a corresponding arm 119 via the suspension 118. The arms 119 are moved by the actuator unit 120. The basic construction of this magnetic storage apparatus is known, and a detailed description thereof will be omitted in this specification.

This embodiment of the magnetic storage apparatusis characterized by the reproducing head of the recording and reproducing head 117. The reproducing head has the structure of any of the first through third embodiments of the magnetoresistive spin-valve sensor described above in conjunction with FIGS. 1 through 8. Of course, the number of magnetic recording media 116 is not limited to three, and only one, two or four or more magnetic recording media 116 may be provided. Consequently, one of a plurality of magnetoresistive spin-valve sensors may be provided depending on the number of recording and reproducing heads 117 provided.

The basic construction of the magnetic storage apparatus is not limited to that shown in FIGS. 9 and 10. In addition, the magnetic recording medium used in the present invention is not limited to magnetic disk.

Further, the present invention is not limited to these embodiments, but various variations and modifications may be made without departing from the scope of the present invention.

The invention claimed is:

1. A magnetoresistive spin-valve sensor comprising:
   a magnetic layer, the magnetic layer forming a free layer and having an effective magnetic layer thickness, excluding a thickness of a magnetically dead layer, greater than 0 and less than approximately 40 Å;
   another magnetic layer which forms a pinned layer;
   a spacer layer interposed between the two magnetic layers;
   an antiferromagnetic layer adjacent to the pinned layer, opposite to the spacer layer;
   a specular layer made of a metal oxide;
   a back layer, made of an AuCu or AgCu alloy, interposed between the magnetic layer and the specular layer, wherein said AuCu alloy has an atomic content of Au between 9.2 and an 15.9 at % and said AgCu alloy has an atomic content of Ag between 11.0 and 28.3 at %, and
   a metal layer having a thickness of 10 to 50 Angstroms disposed adjacent to the specular layer, opposite to the back layer, and made of a metal which improves GMR performance of the magnetoresistive spin-valve sensor, wherein the metal layer is made of a material selected from a group of Ta, Ru, Ni, Fe, Pd, Pt, Mn, Cu, Co, Ti, V, Cr, Zn, Y, Zr, Nb, Mo, Rh, Ag, Au, Hf, W, Re, Os, Ir, Nb and alloys thereof.

2. The magnetoresistive spin-valve sensor as claimed in claim 1, wherein the specular layer is made of a material selected from a group of CoO, $Co_3O_4$, $Co_2O_3$, $Cu_2O$, CuG, $Al_2O_3$, NiO, FeO, $Fe_2O_3$, MnO, $TiO_2$ and alloys thereof.

3. The magnetoresistive spin-valve sensor as claimed in claim 1, wherein the back layer has a thickness of approximately 20 Åor less.

4. A magnetic storage apparatus for reading information from a magnetic recording medium, including:
   a magnetoresistive spin-valve sensor which reads the information from the magnetic recording medium,
   said magnetoresistive spin-valve sensor comprising:
   a magnetic layer, the magnetic layer forming a free layer and having an effective magnetic layer thickness, excluding a thickness of a magnetically dead layer, greater than 0 and less than approximately 40 Å;
   another magnetic layer which forms a pinned layer;
   a spacer layer interposed between the two magnetic layers;
   a specular layer made of a metal oxide;
   an antiferromagnetic layer adjacent to the pinned layer, opposite to the spacer layer;
   a back layer, made of an AuCu or AgCu alloy, interposed between the magnetic layer and the specular layer, wherein said AuCu alloy has an atomic content of Au between 9.2 and an 15.9 at % and said AgCu alloy has an atomic content of Ag between 11.0 and 28.3 at %, and
   a metal layer having a thickness of 10 to 50 Angstrom disposed adjacent to the specular layer, opposite to the back layer, and made of a metal which improves GMR performance of the magnetoresistive spin-valve sensor.

5. The magnetoresistive spin-valve sensor as claimed in claim 1, wherein:
   the specular layer is made of a material selected from a group consisting of CoO, $Co_3O_4$, $Co_2O_3$, $Cu_2O$, CuO, $Al_2O_3$, NiO, FeO, $Fe_2O_3$, MnO, $TiO_2$ and alloys thereof, and
   the back layer has a thickness of approximately 20 Å or less.

* * * * *